United States Patent
Danno

(10) Patent No.: US 10,428,440 B2
(45) Date of Patent: *Oct. 1, 2019

(54) SIC SINGLE CRYSTAL AND PRODUCTION METHOD THEREOF

(71) Applicant: TOYOTA JIDOSHA KABUSHIKI KAISHA, Toyota-shi, Aichi (JP)

(72) Inventor: Katsunori Danno, Toyota (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 465 days.

This patent is subject to a terminal disclaimer.

(21) Appl. No.: 14/394,790

(22) PCT Filed: Apr. 5, 2013

(86) PCT No.: PCT/JP2013/060515
§ 371 (c)(1),
(2) Date: Oct. 16, 2014

(87) PCT Pub. No.: WO2013/157418
PCT Pub. Date: Oct. 24, 2013

(65) Prior Publication Data
US 2015/0128847 A1    May 14, 2015

(30) Foreign Application Priority Data
Apr. 20, 2012 (JP) .................. 2012-096958

(51) Int. Cl.
*C30B 19/12* (2006.01)
*C30B 29/36* (2006.01)
(Continued)

(52) U.S. Cl.
CPC .............. *C30B 19/12* (2013.01); *C30B 9/10* (2013.01); *C30B 17/00* (2013.01); *C30B 19/04* (2013.01); *C30B 19/10* (2013.01); *C30B 29/36* (2013.01)

(58) Field of Classification Search
CPC .......... C30B 17/00; C30B 19/04; C30B 19/10; C30B 19/12; C30B 29/36; C30B 9/10
See application file for complete search history.

(56) References Cited

U.S. PATENT DOCUMENTS

| 5,958,132 A | 9/1999 | Takahashi et al. |
| 2003/0070611 A1 | 4/2003 | Nakamura et al. |

(Continued)

FOREIGN PATENT DOCUMENTS

| CN | 101796227 A | 8/2010 |
| DE | 102 47 017 A1 | 8/2003 |

(Continued)

OTHER PUBLICATIONS

Office Action issued in U.S. Appl. No. 15/021,762 dated Jan. 17, 2018.

(Continued)

*Primary Examiner* — Hua Qi
(74) *Attorney, Agent, or Firm* — Finnegan, Henderson, Farabow, Garrett & Dunner, LLP

(57) ABSTRACT

A high-quality SiC single crystal and a method for producing such a SiC single crystal is provided. In the SiC single crystal, the threading dislocation density including screw dislocation, edge dislocation and micropipe defect is reduced. The method for producing the SiC single crystal according to a solution technique involves bringing an SiC seed crystal into contact with an Si—C solution having a temperature gradient in which a temperature of the Si—C solution is lower towards the surface of the SiC seed crystal. Growing an SiC single crystal includes setting the temperature gradient of the surface region of the Si—C solution to 10° C/cm or below, bringing the (1-100) face of the SiC seed crystal into contact with the Si—C solution, and growing an SiC single crystal on the (1-100) face of the seed crystal at (Continued)

a ratio (single crystal growth rate/temperature gradient) of less than $20 \times 10^{-4}$ cm$^2$/h·° C.

1 Claim, 5 Drawing Sheets

(51) Int. Cl.
*C30B 17/00* (2006.01)
*C30B 9/10* (2006.01)
*C30B 19/10* (2006.01)
*C30B 19/04* (2006.01)

(56) References Cited

U.S. PATENT DOCUMENTS

| | | | |
|---|---|---|---|
| 2004/0050320 | A1 | 3/2004 | Maruyama et al. |
| 2007/0034145 | A1 | 2/2007 | Maruyama et al. |
| 2009/0084309 | A1* | 4/2009 | Sakamoto ............... C30B 19/04 117/73 |
| 2009/0184327 | A1* | 7/2009 | Oyanagi ................. C30B 19/04 257/77 |
| 2009/0194017 | A1 | 8/2009 | Terashima et al. |
| 2010/0236472 | A1 | 9/2010 | Terashima et al. |
| 2011/0200833 | A1* | 8/2011 | Kamei ..................... C30B 9/10 428/446 |
| 2012/0118221 | A1 | 5/2012 | Danno et al. |
| 2013/0220212 | A1 | 8/2013 | Kusunoki et al. |
| 2014/0127466 | A1 | 5/2014 | Danno |
| 2014/0291700 | A1 | 10/2014 | Gunjishima et al. |
| 2015/0128847 | A1 | 5/2015 | Danno |

FOREIGN PATENT DOCUMENTS

| | | |
|---|---|---|
| JP | 5-262599 | 10/1993 |
| JP | 6-227886 | 8/1994 |
| JP | 10-509943 | 9/1998 |
| JP | 2001-294499 A | 10/2001 |
| JP | 2002-255693 A | 9/2002 |
| JP | 2003-119097 | 4/2003 |
| JP | 2003-277193 | 10/2003 |
| JP | 2004-352590 A | 12/2004 |
| JP | 2007-197231 | 8/2007 |
| JP | 2008-105896 | 5/2008 |
| JP | 2009-188117 A | 8/2009 |
| JP | 2012-101960 A | 5/2012 |
| JP | 2014-201466 A | 10/2014 |
| WO | WO 96/17112 | 6/1996 |
| WO | WO 2013/005347 A1 | 1/2013 |
| WO | WO 2013/081164 A1 | 6/2013 |
| WO | WO 2013/157418 A1 | 10/2013 |

OTHER PUBLICATIONS

Office Action issued in U.S. Appl. No. 15/021,762 dated Sep. 12, 2017.
Notice of Allowance and Notice of Allowability issued in U.S. Appl. No. 15/021,762 dated May 23, 2018.
Corrected Notice of Allowability issued in U.S. Appl. No. 15/021,762 dated Jun. 11, 2018.

* cited by examiner

SIC SINGLE CRYSTAL AND PRODUCTION METHOD THEREOF

CROSS-REFERENCE TO RELATED APPLICATIONS

This application is a national phase application of International Application No. PCT/JP2013/060515, filed Apr. 5, 2013, and claims the priority of Japanese Application No. 2012-096958, filed Apr. 20, 2012, the content of both of which is incorporated herein by reference.

TECHNICAL FIELD

The present invention relates to a SiC single crystal that is suitable for a semiconductor element, and to a method for producing it, and more specifically it relates to a high-quality SiC single crystal with low threading dislocation and to a method for producing a high-quality SiC single crystal by a solution process.

BACKGROUND ART

SiC single crystals are thermally and chemically very stable, superior in mechanical strength, and resistant to radiation, and also have superior physical properties, such as high breakdown voltage and high thermal conductivity compared to Si single crystals. They are therefore able to exhibit high output, high frequency, voltage resistance and environmental resistance that cannot be realized with existing semiconductor materials, such as Si single crystals and GaAs single crystals, and are considered ever more promising as next-generation semiconductor materials for a wide range of applications including power device materials that allow high power control and energy efficiency to be achieved, device materials for high-speed large volume information communication, high-temperature device materials for vehicles, radiation-resistant device materials and the like.

Typical growth processes for growing SiC single crystals that are known in the prior art include gas phase processes, the Acheson process and solution processes. Among gas phase processes, for example, sublimation processes have a drawback in that grown single crystals have been prone to hollow penetrating defects known as "micropipe defects", lattice defects, such as stacking faults, and generation of polymorphic crystals. However, most SiC bulk single crystals are conventionally produced by sublimation processes because of the high crystal growth rate. It has also been attempted to reduce defects in grown crystals, and there has been proposed a method of reducing dislocation density propagating in the <0001> direction, by repeating crystal growth on the (11-20) plane and (1-100) plane by using sublimation process (PTL 1). In the Acheson process, heating is carried out in an electric furnace using silica stone and coke as starting materials, and therefore it has not been possible to obtain single crystals with high crystallinity due to impurities in the starting materials.

Solution processes are processes in which molten Si or an alloy melted in molten Si is situated in a graphite crucible and C is dissolved into the molten liquid, and a SiC crystal layer is deposited and grown on a seed crystal substrate set in the low temperature section. Solution processes can be expected to reduce defects since crystal growth is carried out in a state of near thermal equilibrium, compared to gas phase processes. In recent years, therefore, several methods for producing SiC single crystals by solution processes have been proposed (PTL 2), and methods for obtaining SiC single crystals with few crystal defects have also been proposed (PTL 3).

CITATION LIST

Patent Literature

[PTL 1] Japanese Unexamined Patent Publication No. 2003-119097

[PTL 2] Japanese Unexamined Patent Publication No. 2008-105896

[PTL 3] Japanese Unexamined Patent Publication HEI No. 6-227886

SUMMARY OF THE INVENTION

Problems to be Solved by the Invention

As described in PTLs 1 to 3, it has been attempted to reduce defects in grown crystals by sublimation processes or solution processes. However, the aforementioned processes are still inadequate for stably obtaining high-quality SiC single crystals that can be used as semiconductor elements, and it remains difficult to efficiently produce SiC single crystals containing no threading dislocations. In sublimation processes, it is difficult to obtain a single crystal containing virtually or absolutely no threading dislocations. In solution processes as well, since seed crystal dislocations tend to propagate, it is difficult to obtain a single crystal containing virtually or absolutely no threading dislocations in the grown crystal in the direction perpendicular to the growth surface of the seed crystal.

It is an object of the present invention to solve these problems, and to provide a high-quality SiC single crystal having low density of threading dislocations, such as threading screw dislocation, threading edge dislocation and micropipe defects, and a method for producing such SiC single crystal.

Means for Solving the Problems

The invention is a method for producing a SiC single crystal by a solution process, wherein a SiC seed crystal is contacted with a Si—C solution with a temperature gradient, in which the temperature decreases from the interior toward the surface, to grow a SiC single crystal, and wherein the method for producing a SiC single crystal comprises:

limiting the temperature gradient in the surface region of the Si—C solution to no greater than 10° C./cm, contacting the (1-100) plane of the SiC seed crystal with the Si—C solution, and growing a SiC single crystal on the (1-100) plane of the seed crystal at a ratio of less than $20 \times 10^{-4}$ cm$^2$/h·° C. for the growth rate of the SiC single crystal with respect to the temperature gradient (single crystal growth rate/temperature gradient).

The invention is also a SiC single crystal grown on a SiC seed crystal, wherein the threading dislocation density on the (0001) plane of the SiC single crystal is lower than the threading dislocation density on the (0001) plane of the seed crystal.

EFFECT OF THE INVENTION

According to the invention, it is possible to obtain a SiC single crystal with low threading dislocation density on the (0001) plane.

DESCRIPTION OF EMBODIMENTS

Figure 1:
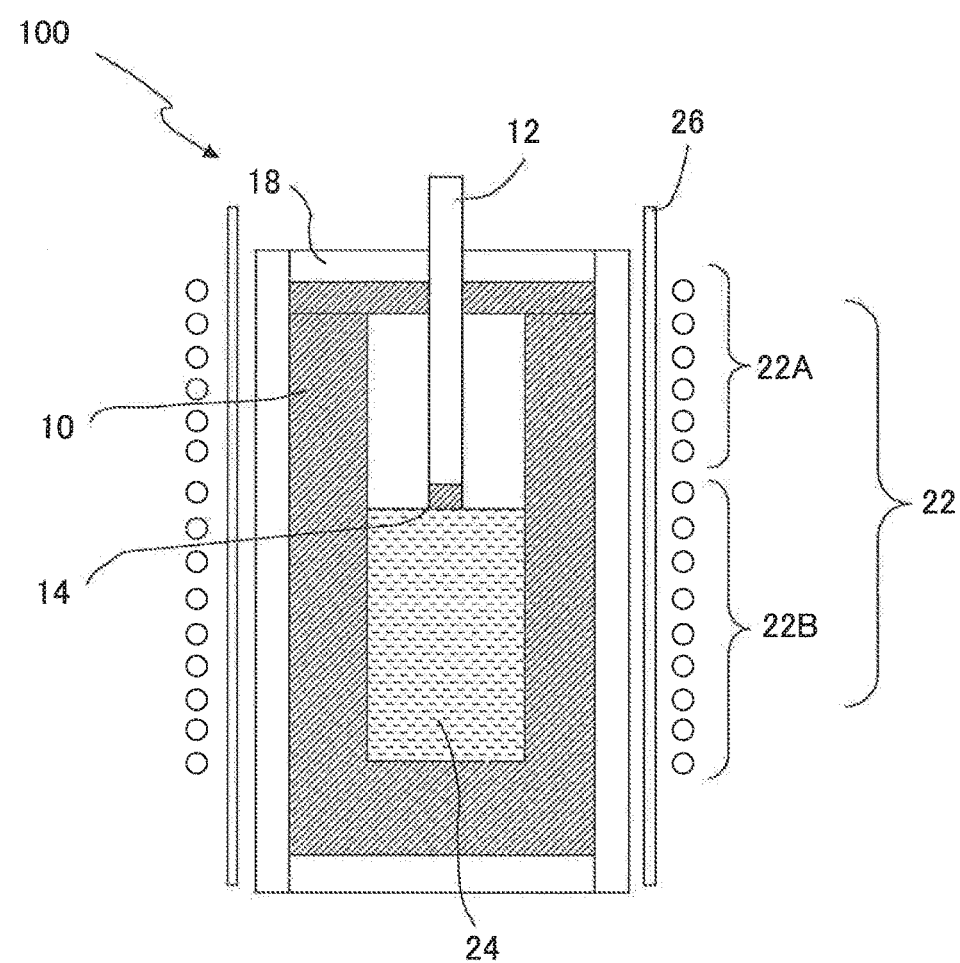
FIG. 1 is a cross-sectional schematic drawing of a single crystal production apparatus based on a solution process, which may be used for the invention.

Throughout the present specification, the indication "-1" in an expression, such as (1-100) plane, is used where normally a transverse line is placed over the numeral.

As described in PTL 1 cited above, RAF growth processes have conventionally been considered effective for low dislocation of crystals, and repeating growth on the (11-20) plane (also known as the a-face) and growth on the (1-100) plane (also known as the m-face) by a sublimation process is carried out to produce crystals with reduced dislocation. However, it is difficult to obtain single crystals without dislocation even by RAF processes, and in addition, they also require repeated growth on the (11-20) plane and (1-100) plane. Therefore, a convenient production method allowing further reduction in dislocation density is desired.

The present inventor has conducted diligent research on a method of producing high-quality SiC single crystals by solution processes, that allow threading dislocation density, such as screw dislocation, edge dislocation and micropipe defects, that are generated in grown crystals due to seed crystals, to be lower than in the prior art.

As a result, it has been found that a SiC single crystal having lower threading dislocation density than the seed crystal can be obtained by performing m-face growth by a solution process using the (1-100) plane (also known as the m-face) of the seed crystal, instead of a-face growth that is typically conducted in the prior art. Furthermore, it has been found that using this method can produce a SiC single crystal with drastically lower threading dislocation density than the seed crystal, by one-time m-face growth, without requiring repeated growth of the single crystal.

In addition, it has been ascertained that the temperature gradient in the surface region of the Si—C solution, and the growth rate of the single crystal with respect to the temperature gradient, each affect the flatness of the growth surface of the SiC single crystal. Furthermore, a method for producing a SiC single crystal that incorporates the conditions of the temperature gradient in the surface region of the Si—C solution and the growth rate of the single crystal has been discovered.

The invention relates to a method for producing a SiC single crystal by a solution process, wherein a SiC seed crystal is contacted with a Si—C solution with a temperature gradient in which the temperature decreases from the interior toward the surface, to grow a SiC single crystal, and wherein the method for producing a SiC single crystal comprises:

limiting the temperature gradient in the surface region of the Si—C solution to no greater than 10° C./cm, contacting the (1-100) plane of the SiC seed crystal with the Si—C solution, and growing a SiC single crystal on the (1-100) plane of the seed crystal at a ratio of less than $20 \times 10^{-4}$ cm$^2$/h·° C. for the growth rate of the SiC single crystal with respect to the temperature gradient (single crystal growth rate/temperature gradient).

According to the present method, it is possible to obtain a SiC single crystal grown on a seed crystal, having a flat growth surface and having lower threading dislocation density on the (0001) plane than the threading dislocation density on the (0001) plane of the seed crystal, the SiC single crystal having preferably a threading dislocation density of no greater than 1/cm$^2$ and more preferably a threading dislocation density of zero.

A solution process is used in the method for producing a SiC single crystal according to the invention. A solution process for production of a SiC single crystal is a method wherein the surface region of the Si—C solution becomes supersaturated due to formation of a temperature gradient in which the temperature decreases from the interior of the Si—C solution toward the surface of the solution in a crucible, and a SiC single crystal is grown on a seed crystal contacting with the Si—C solution.

In the present method, a SiC single crystal having quality commonly used for production of SiC single crystals may be used as the seed crystal. For example, a SiC single crystal commonly formed by a sublimation process may be used as the seed crystal. A SiC single crystal commonly formed by such a sublimation process generally contains numerous threading dislocations and base plane dislocations.

In the present method, a SiC seed crystal with a (1-100) plane is used to grow a (1-100) plane SiC single crystal by using a solution process. The threading dislocation density on the (0001) plane of the SiC single crystal that has been grown on the (1-100) plane is lower than the threading dislocation density on the (0001) plane of the seed crystal, the threading dislocation density preferably being no greater than 1/cm$^2$ and the threading dislocation density being more preferably zero. The seed crystal may have any desired shape, such as plate-like, discoid, cylindrical, columnar, truncated circular conic or truncated pyramidal. The (1-100) plane of the seed crystal may be used as the bottom face of the seed crystal contacting with the Si—C solution surface, and the top face on the opposite side may be used as the face held on the seed crystal holding shaft, such as a graphite shaft.

The temperature gradient in the surface region of the Si—C solution is the temperature gradient in the direction perpendicular to the surface of the Si—C solution, which is a temperature gradient where the temperature falls from the interior of the Si—C solution toward the surface of the solution. The temperature gradient can be calculated by measuring the temperature A on the surface of the Si—C solution which is the low-temperature side, and temperature B which is the high-temperature side at a prescribed depth from the surface of the Si—C solution in the direction perpendicular to the solution side, by using a thermocouple, and dividing the temperature difference by the distance between the positions at which temperature A and temperature B were measured. For example, when measuring the temperature gradient between the surface of the Si—C solution and the position at depth D cm from the surface of the Si—C solution in the direction perpendicular to the solution side, calculation can be performed by the following formula:

$$\text{temperature gradient}(° C./cm) = (B-A)/D$$

which is the difference between the surface temperature A of the Si—C solution and the temperature B at a position at depth D cm from the surface of the Si—C solution in the direction perpendicular to the solution side, divided by D cm.

In the present method, the temperature gradient in the surface region of the Si—C solution is 10° C./cm or less. It has been found that limiting the temperature gradient in the surface region of the SiC solution to within this range makes it easier to obtain a SiC single crystal containing no threading dislocations and having a flat surface.

A large temperature gradient near the seed crystal substrate can speed the growth rate for the SiC single crystal. However, if the temperature gradient is too large, it will be difficult to obtain a flat growth surface. Therefore, the temperature gradient range must be controlled as described above.

There is no particular restriction on the lower limit for the temperature gradient in the surface region of the Si—C solution, and for example, it may be 2° C./cm or greater, 4° C./cm or greater, 6° C./cm or greater or 8° C./cm or greater.

The range in which the temperature gradient is controlled is preferably to a depth of 3 mm and more preferably to a depth of 20 mm from the surface of the Si—C solution.

When the range of control of the temperature gradient is too shallow, the range in which the degree of supersaturation of C is controlled also becomes shallow, and growth of the SiC single crystal may become unstable. If the range of control of the temperature gradient is too deep, the range in which the degree of supersaturation of C is controlled also becomes deep, which is effective for stable growth of the SiC single crystal. However, in actuality the depth contributing to single crystal growth is a range up to a depth of a few mm from the surface of the Si—C solution. Consequently, it is preferred to control the temperature gradient within the depth range specified above in order to perform stable SiC single crystal growth and temperature gradient control.

Control of the temperature gradient in the surface region of the Si—C solution will be described in greater detail below with reference to the accompanying drawings. It is possible to form the prescribed temperature gradient in the direction perpendicular to the surface of the Si—C solution by adjusting the placement, construction and output of the heating device, such as a high-frequency coil, situated around the crucible of the single crystal production apparatus.

In the present method, the ratio of the SiC single crystal growth rate (μm/h) with respect to the temperature gradient in the surface region of the Si—C solution (° C./cm) (single crystal growth rate/temperature gradient) is controlled to lower than $20 \times 10^{-4}$ cm$^2$/h·° C. and preferably lower than $12 \times 10^{-4}$ cm$^2$/h·° C., for growth of the SiC single crystal. It has been found that, in addition to controlling the temperature gradient in the surface region of the Si—C solution, limiting the single crystal growth rate with respect to the temperature gradient to the range specified above makes it possible to stably obtain a SiC single crystal containing no threading dislocations and having a flat surface.

The growth rate of the SiC single crystal can be adjusted by controlling the degree of supersaturation of the Si—C solution. If the degree of supersaturation of the Si—C solution is increased the SiC single crystal growth rate increases, and if the degree of supersaturation is decreased the SiC single crystal growth rate decreases.

The degree of supersaturation of the Si—C solution can be controlled primarily by the surface temperature of the Si—C solution and the temperature gradient in the surface region of the Si—C solution. For example, the degree of supersaturation can be lowered by decreasing the temperature gradient in the surface region of the Si—C solution or the degree of supersaturation can be raised by increasing the temperature gradient in the surface region of the Si—C solution, while maintaining a constant surface temperature of the Si—C solution.

If heat loss through the seed crystal holding shaft is varied, the degree of supersaturation of the Si—C solution near the seed crystal can vary, altering the growth rate of the SiC single crystal. Thus, the thermal conductivity can be modified by selecting the material for the seed crystal holding shaft, and the diameter of the seed crystal holding shaft can also be varied to modify the degree of heat loss, thereby allowing the growth rate of the SiC single crystal to be altered.

The presence or absence of threading dislocation can be evaluated by performing mirror polishing so as to expose the (0001) plane, and performing molten alkali etching using molten potassium hydroxide, sodium peroxide or the like to accentuate the dislocations, and observing the surface of the SiC single crystal with a microscope.

Placement of the seed crystal in the single crystal production apparatus may be done by holding the top face of the seed crystal on the seed crystal holding shaft, as described above.

Contact of the seed crystal with the Si—C solution may be performed by lowering the seed crystal holding shaft holding the seed crystal toward the Si—C solution surface, and contacting it with the Si—C solution while keeping the bottom face of the seed crystal parallel to the Si—C solution surface. Also, the seed crystal may be held at a prescribed position relative to the Si—C solution surface for growth of the SiC single crystal.

The holding position of the seed crystal may be such that the position of the bottom face of the seed crystal matches the Si—C solution surface, or such that it is below the Si—C solution surface or is above the Si—C solution surface. When it is held so that the bottom face of the seed crystal is at a position above the Si—C solution surface, the seed crystal is contacted once with the Si—C solution so that the Si—C solution contacts with the bottom face of the seed crystal, and it is then raised to the prescribed position. The position of the bottom face of the seed crystal may match the Si—C solution surface or be lower than the Si—C solution surface, but in order to prevent generation of polycrystals, it is preferably such that the Si—C solution does not contact with the seed crystal holding shaft. In such methods, the position of the seed crystal may be adjusted during growth of the single crystal.

The seed crystal holding shaft may be a graphite shaft holding the seed crystal substrate at one end face. The seed crystal holding shaft may have any desired shape, such as cylindrical or columnar, and a graphite shaft having the same end face shape as the top face of the seed crystal may be used.

A SiC single crystal grown by the present method can be used as a seed crystal for further growth of the SiC single crystal. While a SiC single crystal grown on the (1-100) plane by the present method contains a small amount of base plane dislocation, the threading dislocation is very minimal or zero, and therefore further crystal growth using the (000-1) face of the SiC single crystal as the origin can produce a very high-quality SiC single crystal that is free not only of threading dislocation but also of base plane dislocation. This is because very little or absolutely no threading dislocation is present on the (000-1) face, which is the growth origin of the seed crystal, and therefore very little or absolutely no threading dislocation propagates from the seed crystal to the grown crystal, while any base plane dislocation that may be present in the seed crystal does not easily propagate to the (000-1) face grown crystal. This can be performed by a solution process, or it may be performed by a sublimation process.

According to the invention, a Si—C solution is a solution in which C is dissolved where the solvent is a molten liquid of Si or Si/X (X is one or more metals other than Si). X is not particularly restricted so long as it is one or more metals and can form a liquid phase (solution) that is in a state of thermodynamic equilibrium with SiC (solid phase). Suitable examples of X metals include Ti, Mn, Cr, Ni, Ce, Co, V and Fe.

The Si—C solution is preferably a Si—C solution wherein the solvent is a molten liquid of Si/Cr/X (where X represents one or more metals other than Si and Cr). A Si—C solution wherein the solvent is a molten liquid with an atomic composition percentage of Si/Cr/X=30-80/20-60/0-10, has low variation in C dissolution and is therefore preferred. For example, Cr, Ni and the like may be loaded into the crucible in addition to Si, to form a Si—Cr solution, Si—Cr—Ni solution or the like.

The Si—C solution preferably has a surface temperature of 1800° C. to 2200° C., which will minimize fluctuation in the amount of dissolution of C into the Si—C solution.

Temperature measurement of the Si—C solution can be carried out by using a thermocouple or radiation thermometer. From the viewpoint of high temperature measurement and preventing inclusion of impurities, the thermocouple is preferably a thermocouple comprising tungsten-rhenium wire covered with zirconia or magnesia glass, placed inside a graphite protection tube.

FIG. 1 shows an example of a SiC single crystal production apparatus suitable for carrying out the method of the invention. The illustrated SiC single crystal production apparatus 100 comprises a crucible 10, wherein the crucible 10 receives a Si—C solution 24 having C dissolved in a molten liquid of Si or Si/X, a temperature gradient is formed in which the temperature is decreased from the interior of the Si—C solution toward the surface of the solution, and the seed crystal substrate 14 that is held at the tip of the vertically movable graphite shaft 12 is contacted with the Si—C solution 24 to allow growth of the SiC single crystal. The crucible 10 and the graphite shaft 12 are preferably rotated.

The Si—C solution 24 is prepared by loading the starting materials into the crucible, melting them by heating to prepare Si or Si/X molten liquid, and dissolving C therein.

If the crucible 10 is a carbonaceous crucible, such as a graphite crucible, or SiC crucible, C will dissolve into the molten liquid by dissolution of the crucible 10, thereby forming a Si—C solution. This will avoid the presence of undissolved C in the Si—C solution 24, and prevent waste of SiC by deposition of the SiC single crystal onto the undissolved C. The supply of C may be performed by utilizing a method of, for example, blowing in hydrocarbon gas or loading a solid C source together with the molten liquid starting material, or these methods may be combined together with dissolution of the crucible.

For thermal insulation, the outer periphery of the crucible 10 is covered with a heat-insulating material 18. These are housed together inside a quartz tube 26. A high-frequency coil 22 for heating is disposed around the outer periphery of the quartz tube 26. The high-frequency coil 22 may be configured with an upper level coil 22A and a lower level coil 22B The upper level coil 22A and lower level coil 22B can be independently controllable.

Since the temperatures of the crucible 10, heat-insulating material 18, quartz tube 26 and high-frequency coil 22 become high, they are situated inside a water-cooling chamber. The water-cooling chamber is provided with a gas inlet and a gas exhaust vent to allow atmospheric modification in the apparatus to Ar, He or the like.

The temperature of the Si—C solution usually has a temperature distribution with a lower temperature at the surface of the Si—C solution than the interior thereof due to thermal radiation and the like. Further, a prescribed temperature gradient can be formed in the Si—C solution 24 in the direction perpendicular to the surface of the Si—C solution 24 so that an upper portion of the solution in which the seed crystal substrate 14 is immersed is at low temperature and a lower portion of the solution is at high temperature, by adjusting the number of coils and spacing of the high-frequency coil 22, the positional relationship of the high-frequency coil 22 and the crucible 10 in the height direction, and the output of the high-frequency coil. For example, the output of the upper level coil 22A may be smaller than the output of the lower level coil 22B, to form a prescribed temperature gradient in the Si—C solution 24 in which an upper portion of the solution is at low temperature and a lower portion of the solution is at high temperature.

The C dissolved in the Si—C solution 24 is dispersed by diffusion and convection. In the vicinity of the bottom face of the seed crystal substrate 14, a temperature gradient is formed, in which the temperature is lower compared to a lower portion of the Si—C solution 24, by utilizing output control of the upper level and lower level of the coil 22, heat radiation from the surface of the Si—C solution, and heat loss through the graphite shaft 12. When the C dissolved in the lower part of the solution where the temperature and the solubility are high, reaches the region near the bottom face of the seed crystal substrate where the temperature and the solubility are low, a supersaturated state appears and a SiC single crystal is grown on the seed crystal substrate by virtue of supersaturation as a driving force.

In some embodiments, melt back may be carried out in which the surface layer of the SiC seed crystal substrate is dissolved in the Si—C solution and removed prior to growth of a SiC single crystal. Since the surface layer of the seed crystal substrate on which the SiC single crystal is grown may have an affected layer, such as a dislocation, a natural oxide film, or the like, and removal of the same by dissolution prior to growth of a SiC single crystal is effective for growing a high-quality SiC single crystal. Although the thickness of a layer to be dissolved depends on processed conditions of the surface of a SiC seed crystal substrate, it is preferably about 5 to 50 µm for sufficient removal of an affected layer and a natural oxide film.

The meltback may be performed by forming in the Si—C solution a temperature gradient in which the temperature increases from the interior of the Si—C solution toward the surface of the solution, i.e. by forming a temperature gradient in a direction opposite to the case of SiC single crystal growth. The temperature gradient in the opposite direction can be formed by controlling output of the high-frequency coil.

The meltback can also be performed, without forming a temperature gradient in the Si—C solution, by simply immersing the seed crystal substrate in the Si—C solution heated to a temperature higher than the liquidus temperature. In that case, the dissolution rate increases with higher Si—C solution temperature, but control of the amount of dissolution becomes difficult, while a low temperature may slow the dissolution rate.

In the some embodiments, the seed crystal substrate may be preheated in advance, and then the same is contacted with the Si—C solution. If the seed crystal substrate at a low temperature is contacted with the Si—C solution at a high temperature, heat shock dislocations may be generated in the seed crystal. Preheating of the seed crystal substrate before contacting the seed crystal substrate with the Si—C solution prevents heat shock dislocation and is effective for growth of a high-quality SiC single crystal. The seed crystal substrate may be heated together with the graphite shaft. Alternatively, the Si—C solution may be heated to the temperature for crystal growth after contacting the seed crystal with the Si—C solution at a relatively low temperature. This is also effective for preventing heat shock dislocations and growing a high-quality SiC single crystal.

The invention also relates to a SiC single crystal grown on a seed crystal, wherein the threading dislocation density on the (0001) plane of the SiC single crystal is lower than the threading dislocation density on the (0001) plane of the seed crystal. The threading dislocation density on the (0001) plane of the SiC single crystal is preferably no greater than $1/cm^2$ and more preferably zero.

EXAMPLES

Example 1

A SiC single crystal formed by a sublimation process, which was a 10 mm-square 4H—SiC single plate crystal with a thickness of 0.8 mm and the bottom face as the (1-100) plane, was prepared for use as a seed crystal substrate. The top face of the seed crystal substrate was bonded to approximately the center section of the end face of a cylindrical graphite shaft with a length of 20 cm and a diameter of 12 mm, using a graphite adhesive, in such a manner that the end face of the graphite shaft was within the top face of the seed crystal and the end face of the graphite shaft did not protrude beyond the top face of the seed crystal.

A single crystal production apparatus as shown in FIG. 1 was used, and Si/Cr/Ni were loaded in as a molten liquid materials at an atomic composition percentage of 50:40:10, in a graphite crucible with an inner diameter of 40 mm and a height of 185 mm for housing a Si—C solution. The air in the single crystal production apparatus was exchanged with argon. The high-frequency coil was electrified to melt the starting material in the graphite crucible by heating, thereby forming a Si/Cr/Ni alloy molten liquid. Then, a sufficient amount of C was dissolved into the Si/Cr/Ni alloy molten liquid from the graphite crucible to form a Si—C solution.

The outputs of the upper level coil and lower level coil were adjusted to heat the graphite crucible, increasing the temperature at the surface of the Si—C solution to 1820° C. The temperature was measured by using a vertically movable thermocouple comprising a tungsten-rhenium wire placed in a graphite protection tube. Seed touching was performed, in which the position of the bottom face of the seed crystal was placed at a position matching the liquid surface of the Si—C solution, and the bottom face of the seed crystal was contacted with the Si—C solution, while keeping the bottom face of the seed crystal bonded to the graphite shaft parallel to the Si—C solution surface.

The temperature of the surface of the Si—C solution was further increased to 1930° C., and the temperature gradient in which the temperature fell from the solution interior toward the solution surface in a range of 20 mm from the solution surface, was controlled to 8.6° C./cm, for growth of a crystal.

Figure 2:
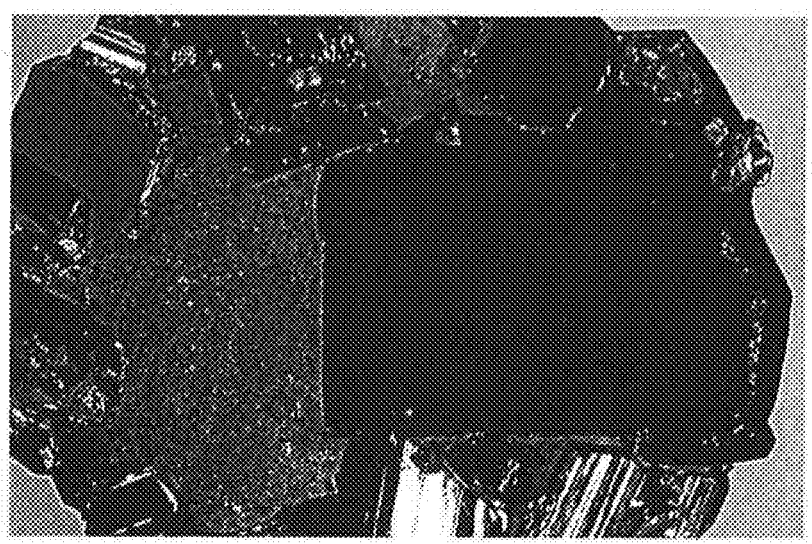
FIG. 2 is a photograph of the outer appearance of the growth surface of a SiC single crystal grown on the (1-100) plane, according to the invention.

Upon completion of the crystal growth, the graphite shaft was raised and the seed crystal and the SiC crystal grown on the seed crystal were severed from the Si—C solution and the graphite shaft and recovered. The obtained grown crystal was a single crystal, with a growth rate of 45 µm/h. FIG. 2 shows a photograph of the grown single crystal observed from the growth surface. The growth surface of the obtained single crystal was flat, as shown in FIG. 2.

Example 2

A crystal was grown and recovered under the same conditions as Example 1, except that the temperature of the surface of the Si—C solution during growth of the crystal was 2030° C. and the temperature gradient was 9.0° C./cm.

The obtained grown crystal was a single crystal, with a growth rate of 100 µm/h. The growth surface of the obtained single crystal was flat, similar to the single crystal grown in Example 1.

Example 3

A crystal was grown and recovered under the same conditions as Example 1, except that the temperature of the surface of the Si—C solution during growth of the crystal was 1920° C. and the temperature gradient was 9.3° C./cm.

The obtained grown crystal was a single crystal, with a growth rate of 80 µm/h. The growth surface of the obtained single crystal was flat, similar to the single crystal grown in Example 1.

Example 4

A crystal was grown and recovered under the same conditions as Example 1, except that the temperature of the surface of the Si—C solution during growth of the crystal was 1920° C. and the temperature gradient was 9.0° C./cm.

The obtained grown crystal was a single crystal, with a growth rate of 60 µm/h. The growth surface of the obtained single crystal was flat, similar to the single crystal grown in Example 1.

Example 5

A crystal was grown and recovered under the same conditions as Example 1, except that a SiC single crystal substrate formed by a sublimation process, which was a 10 mm-square 4H—SiC single plate crystal with a thickness of 3.5 mm and the bottom face as the (1-100) plane, was prepared for use as a seed crystal substrate, the temperature of the surface of the Si—C solution during growth of the crystal was 2000° C., seed touching was carried out by contacting the bottom face of the seed crystal with the Si—C solution at 2000° C., and the temperature gradient was 10.0° C./cm.

The obtained grown crystal was a single crystal, with a growth rate of 60 μm/h. The growth surface of the obtained single crystal was flat, similar to the single crystal grown in Example 1.

Example 6

A crystal was grown and recovered under the same conditions as Example 5, except that a SiC single crystal substrate formed by a sublimation process, which was a 10 mm-square 4H—SiC single plate crystal with a thickness of 2.0 mm and the bottom face as the (1-100) plane, was prepared for use as a seed crystal substrate.

The obtained grown crystal was a single crystal, with a growth rate of 101 μm/h. The growth surface of the obtained single crystal was flat, similar to the single crystal grown in Example 1.

Example 7

A crystal was grown and recovered under the same conditions as Example 5, except that a SiC single crystal substrate formed by a sublimation process, which was a 10 mm-square 4H—SiC single plate crystal with a thickness of 1.5 mm and the bottom face as the (1-100) plane, was prepared for use as a seed crystal substrate.

The obtained grown crystal was a single crystal, with a growth rate of 132 μm/h. The growth surface of the obtained single crystal was flat, similar to the single crystal grown in Example 1.

(Observation of Threading Dislocations)

The SiC single crystals grown in Examples 1 to 7 were each cut with a diamond saw to expose the (0001) plane, and polished with two different diamond slurries (slurry particle diameters: 6 μm and 3 μm) for mirror finishing. Next, each grown SiC single crystal was dipped for 5 minutes in a 500° C. molten liquid comprising a mixture of potassium hydroxide (product of Nacalai Tesque, Inc.) and potassium peroxide (product of Wako Pure Chemical Industries, Ltd.), for etching. Each SiC single crystal was removed from the mixed molten liquid and subjected to ultrasonic cleaning in purified water, and a microscope (product of Nikon Corp.) was then used to observe dislocation.

Figure 3:
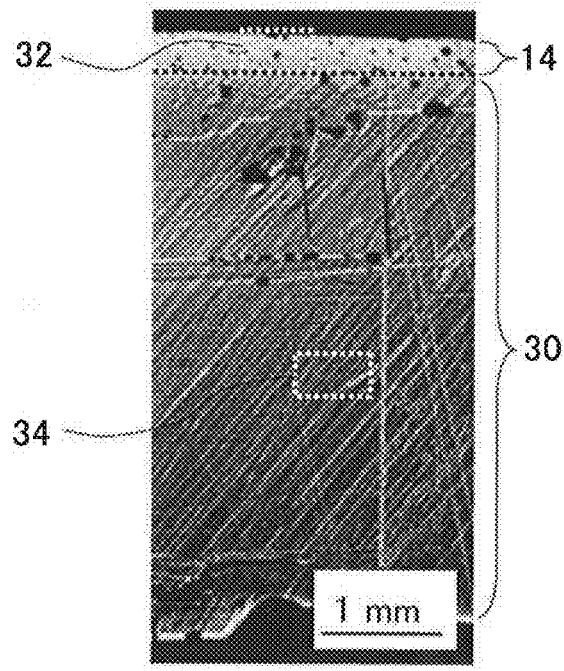
FIG. 3 is a photomicrograph of a (0001) plane obtained by cutting out the (0001) plane from a crystal grown on the (1-100) plane of a seed crystal and performing molten alkali etching, according to the invention.
Figure 4:
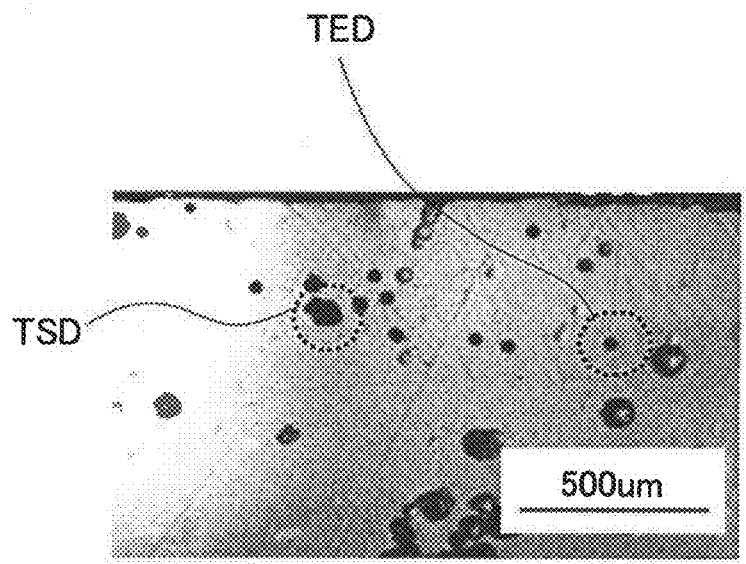
FIG. 4 is a photograph showing an enlarged view of the seed crystal portion of FIG. 3.
Figure 5:
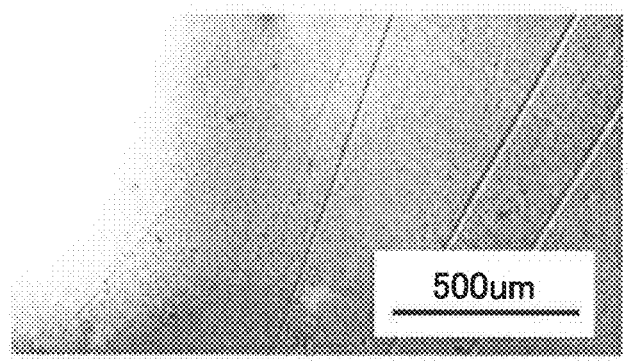
FIG. 5 is a photograph showing an enlarged view of the grown crystal portion of FIG. 3.

FIGS. 3 to 5 show photomicrographs of the molten alkali-etched (0001) planes of the single crystals obtained in Example 1. FIG. 3 is a photograph of the entirety including the seed crystal 14 and the grown crystal 30, FIG. 4 shows a magnified photograph of a location 32 in the seed crystal 14 of FIG. 3, and FIG. 5 shows a magnified photograph of a location 34 in the grown crystal 30. Threading screw dislocation (TSD) and threading edge dislocation (TED) were detected in observation of the seed crystal. Although slight base plane dislocation (BPD) was seen in the grown crystal, threading dislocation, such as threading screw dislocation (TSD), threading edge dislocation (TED) and micropipe defects, were not detected, and no threading dislocation was present. Likewise, no threading dislocation was detected in the single crystals grown in Examples 2 to 7, demonstrating that no threading dislocation was present.

Comparative Example 1

A 10 mm-square 4H—SiC single plate crystals with thickness of 1 mm and (11-20) planes was prepared, and it was used as a seed crystal substrate having the (11-20) plane as the bottom face. The top face of the seed crystal substrate was bonded to approximately the center section of the end face of a graphite shaft, using a graphite adhesive, similar to Example 1.

A crystal was grown and recovered under the same conditions as Example 1, except that the temperature of the surface of the Si—C solution during growth of the crystal was 1930° C. and the temperature gradient was 8.2° C./cm.

Figure 6:
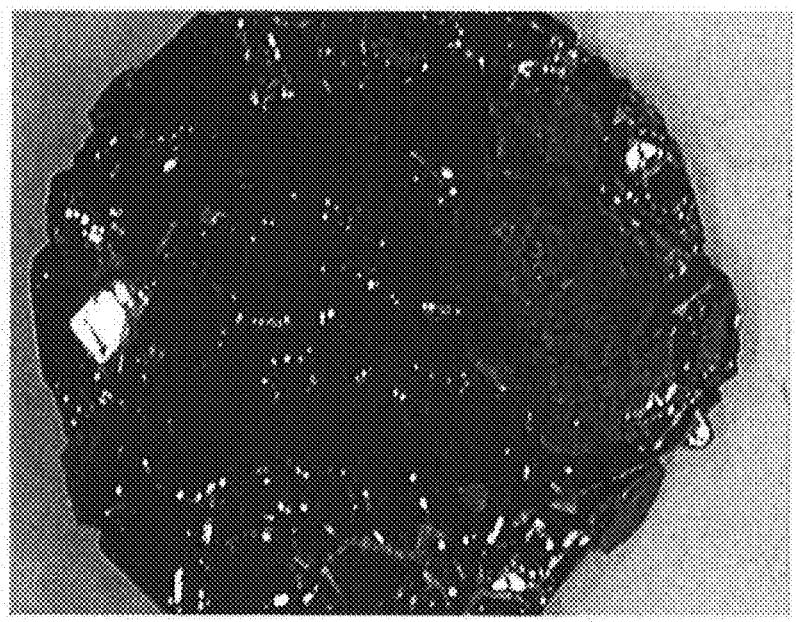
FIG. 6 is a photograph of the outer appearance of the growth surface of a crystal grown on the (11-20) plane.

FIG. 6 shows a photograph of the grown crystal observed from the growth surface. The growth surface of the obtained crystal was severely rough without formation of a flat surface, as shown in FIG. 6, and single crystal growth did not occur.

Comparative Example 2

A crystal was grown and recovered under the same conditions as Example 1, except that the temperature of the surface of the Si—C solution during growth of the crystal was 1890° C. and the temperature gradient was 10.3° C./cm.

Figure 7:
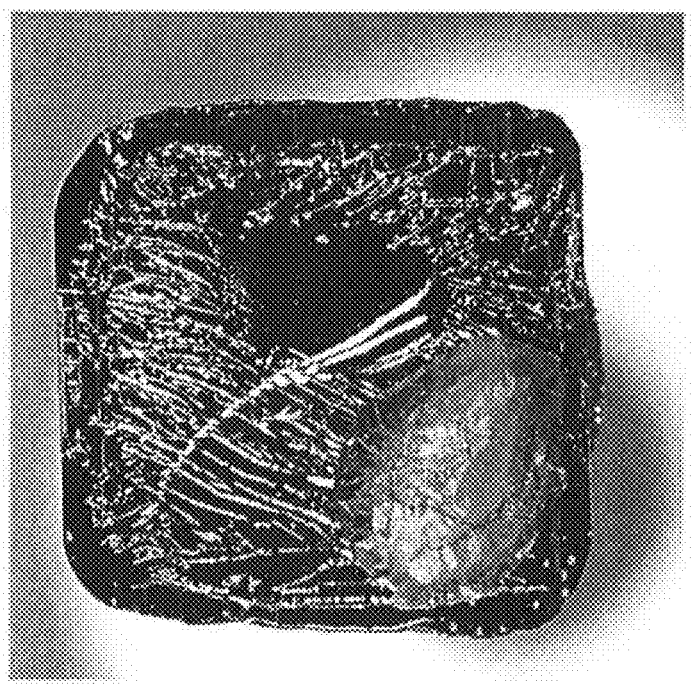
FIG. 7 is a photograph of the outer appearance of the growth surface of a crystal grown on the (1-100) plane.

The growth rate of the obtained crystal was 83 μm/h. FIG. 7 shows a photograph of the grown crystal observed from the growth surface. Although the obtained crystal was a single crystal, the growth surface was rough as shown in FIG. 7 and a flat surface could not be obtained.

Comparative Example 3

A crystal was grown and recovered under the same conditions as Example 1, except that the temperature of the surface of the Si—C solution during growth of the crystal was 1870° C. and the temperature gradient was 12.0° C./cm.

The growth rate of the obtained crystal was 144 μm/h. Although the obtained crystal was a single crystal, the growth surface was rough similar to Comparative Example 2, and a flat surface could not be obtained.

Comparative Example 4

A crystal was grown and recovered under the same conditions as Example 1, except that the temperature of the surface of the Si—C solution during growth of the crystal was 2000° C. and the temperature gradient was 15.0° C./cm.

The growth rate of the obtained crystal was 144 μm/h. Although the obtained crystal was a single crystal, the growth surface was rough similar to Comparative Example 2, and a flat surface could not be obtained.

Comparative Example 5

A crystal was grown and recovered under the same conditions as Example 1, except that the temperature of the surface of the Si—C solution during growth of the crystal was 1990° C. and the temperature gradient was 8.6° C./cm.

The growth rate of the obtained crystal was 172 μm/h. Although the obtained crystal was a single crystal, the growth surface was rough similar to Comparative Example 2, and a flat surface could not be obtained.

Figure 8:
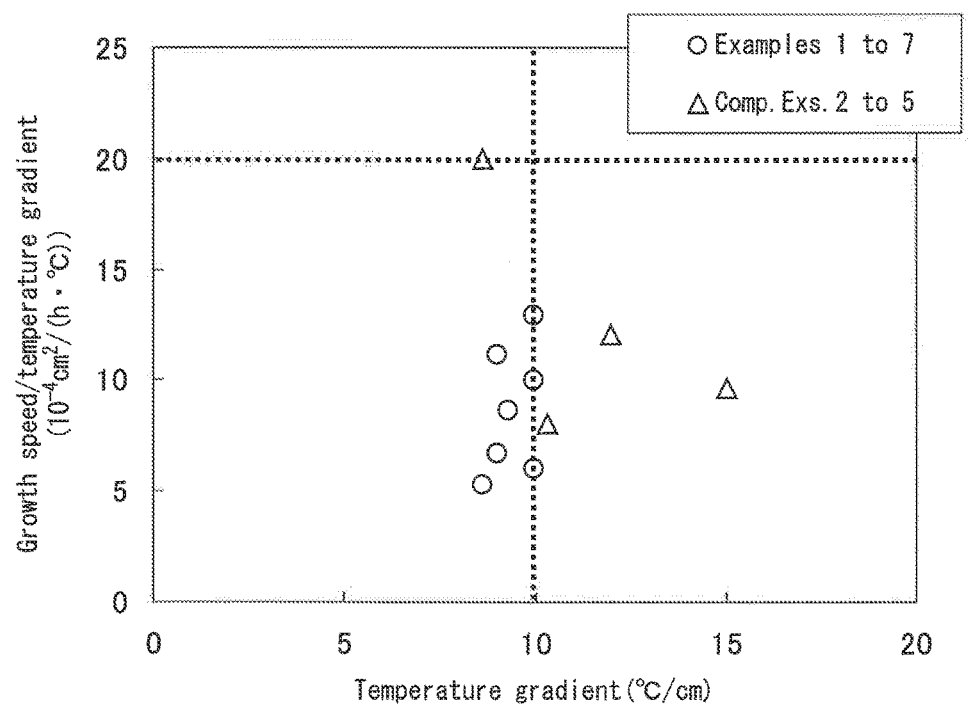
FIG. 8 is a graph showing the range for growth conditions, according to the temperature gradient in the surface region of the Si—C solution and the single crystal growth rate/temperature gradient ratio, for (1-100) plane growth.

Table 1 shows the growth surface, temperatures of the surface of the Si—C solution, temperature gradients in the surface region of the Si—C solution, types of crystals obtained, crystal growth rates and growth rate/temperature gradient ratios, for Examples 1 to 7 and Comparative Examples 1 to 5. FIG. 8 shows the optimal range for the growth conditions of the temperature gradient in the surface region of the Si—C solution and the single crystal growth rate/temperature gradient ratio, for (1-100) plane growth in Examples 1 to 7 and Comparative Examples 2 to 5.

TABLE 1

|  | Growth face | Seed crystal thickness (mm) | Grown crystal type | Seed touching temperature (° C.) | Growth temperature (° C.) | Temperature gradient (° C./cm) | Growth speed (μm/h) | Growth speed/ temp. gradient ($10^{-4}$ cm$^2$/ (h · ° C.)) |
|---|---|---|---|---|---|---|---|---|
| Example 1 | (1-100) | 0.8 | Single crystal | 1820 | 1930 | 8.6 | 45 | 5.2 |
| Example 2 | (1-100) | 0.8 | Single crystal | 1820 | 2030 | 9.0 | 100 | 11.1 |
| Example 3 | (1-100) | 0.8 | Single crystal | 1820 | 1920 | 9.3 | 80 | 8.6 |
| Example 4 | (1-100) | 0.8 | Single crystal | 1820 | 1920 | 9.0 | 60 | 6.7 |
| Example 5 | (1-100) | 3.5 | Single crystal | 2000 | 2000 | 10.0 | 60 | 6.0 |
| Example 6 | (1-100) | 2.0 | Single crystal | 2000 | 2000 | 10.0 | 101 | 10.1 |
| Example 7 | (1-100) | 1.5 | Single crystal | 2000 | 2000 | 10.0 | 132 | 13.2 |
| Comp. Ex. 1 | (11-20) | 0.8 | Single crystal | 1820 | 1930 | 8.2 | — | — |
| Comp. Ex. 2 | (1-100) | 0.8 | Single crystal | 1820 | 1890 | 10.3 | 83 | 8.1 |
| Comp. Ex. 3 | (1-100) | 0.8 | Single crystal | 1820 | 1870 | 12.0 | 144 | 12.0 |
| Comp. Ex. 4 | (1-100) | 0.8 | Single crystal | 1820 | 2000 | 15.0 | 144 | 9.6 |
| Comp. Ex. 5 | (1-100) | 0.8 | Single crystal | 1820 | 1990 | 8.6 | 172 | 20.0 |

No single crystal was obtained with (11-20) plane growth, but a single crystal was obtained by growth on the (1-100) plane. In addition, by performing crystal growth under conditions with the temperature gradient in the surface region of the Si—C solution limited to no greater than 10° C./cm and the ratio of the crystal growth rate with respect to the temperature gradient (growth rate/temperature gradient) at less than 20 ($10^{-4}$ cm$^2$/(h·° C.)), a SiC single crystal having a flat surface and with no threading dislocation on the (0001) plane was obtained.

EXPLANATION OF SYMBOLS

100 Single crystal production apparatus
10 Graphite crucible
12 Graphite shaft
14 Seed crystal substrate
18 Heat-insulating material
22 High-frequency coil
22A Upper level high-frequency coil
22B Lower level high-frequency coil
24 Si—C solution
26 Quartz tube
30 SiC grown single crystal
32 Location in seed crystal section
34 Location in grown single crystal section

What is claimed is:

1. A method for producing a SiC single crystal by a solution method, wherein a first SiC seed crystal is contacted with a Si—C solution with a temperature gradient in which a temperature of the SiC solution decreases from an interior toward a surface, to grow a first SiC single crystal, and wherein the method for producing the SiC single crystal consists of:

limiting the temperature gradient in a surface region of the Si—C solution to no greater than 10° C/cm;

contacting (1-100) plane of the first SiC seed crystal with the Si—C solution;

growing the first SiC single crystal on the (1-100) plane of the first seed crystal at a ratio of less than 20×10$^{-4}$ cm$^2$/h·° C for a growth rate of the first SiC single crystal with respect to the temperature gradient to provide the first SiC single crystal, wherein the first SiC single crystal has a (000-1) face;

using the first SiC single crystal grown on the (1-100) plane of the first seed crystal as a second seed crystal; and growing a second SiC single crystal on the (000-1) face of the second seed crystal.

* * * * *